(12) United States Patent
Fair et al.

(10) Patent No.: US 7,905,105 B2
(45) Date of Patent: Mar. 15, 2011

(54) MODULAR IN-FRAME PUMPED REFRIGERANT DISTRIBUTION AND HEAT REMOVAL SYSTEM

(75) Inventors: Philip Chappelle Fair, Naperville, IL (US); Marc Scott Hodes, Dublin (IE); Wei Ling, Randolph, NJ (US); Alan Michael Lyons, New Providence, NJ (US); Salvatore Joseph Messana, Morris Plains, NJ (US); Paul Mark Rominski, Morris Plains, NJ (US); Majid Safavi, Naperville, IL (US); William Harold Scofield, Batavia, IL (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 559 days.

(21) Appl. No.: 12/011,402

(22) Filed: Jan. 25, 2008

(65) Prior Publication Data
US 2009/0188264 A1 Jul. 30, 2009

(51) Int. Cl.
F25D 23/12 (2006.01)
(52) U.S. Cl. .................................... 62/259.2
(58) Field of Classification Search ............... 62/259.2; 165/80.4; 361/690, 694, 695
See application file for complete search history.

(56) References Cited

U.S. PATENT DOCUMENTS

| | | | | |
|---|---|---|---|---|
| 5,673,029 A | * | 9/1997 | Behl et al. | 340/635 |
| 5,718,628 A | * | 2/1998 | Nakazato et al. | 454/184 |
| 6,279,337 B1 | * | 8/2001 | Davidson et al. | 62/259.2 |
| 6,628,520 B2 | * | 9/2003 | Patel et al. | 361/696 |
| 6,904,968 B2 | * | 6/2005 | Beitelmal et al. | 165/247 |
| 7,051,802 B2 | | 5/2006 | Baer | |
| 7,254,022 B2 | * | 8/2007 | Ebermann | 361/696 |
| 2006/0102322 A1 | * | 5/2006 | Madara et al. | 165/104.21 |

* cited by examiner

Primary Examiner — Melvin Jones
(74) Attorney, Agent, or Firm — Carmen Patti Law Group, LLC

(57) ABSTRACT

An apparatus, method and system are provided for a modular in-frame pumped refrigerant distribution system. Specifically, a micro-channel heat exchanger is positioned in an equipment cabinet close to equipment that generates heat. More specifically, the micro-channel heat exchanger may be positioned on a) a shelf above the equipment, b) the back side of the equipment, or c) a shelf below the equipment. The micro-channel heat exchanger is operable to receive a refrigerant supplied by an external heat exchanger along a primary flow path, transfer heat from air above and/or near the equipment to a coil of the micro-channel heat exchanger, circulate the refrigerant to extract the heat, and return the refrigerant with an extracted portion of generated heat to the external heat exchanger along a secondary flow path. The external heat exchanger may remove extracted heat from a building via a building chilled water system or an outdoor condenser unit.

29 Claims, 5 Drawing Sheets

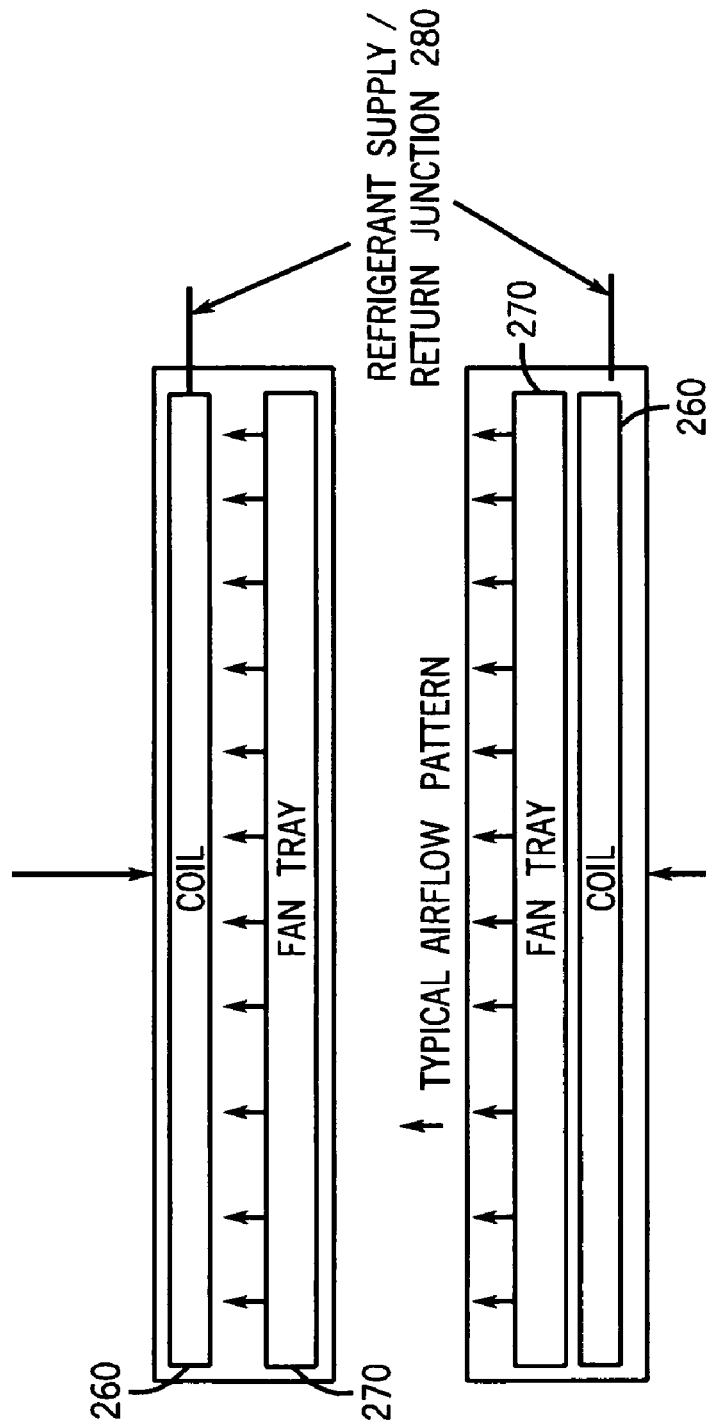

MODULAR IN-FRAME PUMPED REFRIGERANT DISTRIBUTION AND HEAT REMOVAL SYSTEM

TECHNICAL FIELD

This invention relates to the art of cooling systems, and more particularly to a technique for the removal of excessively large amounts of heat generated within electronic equipment cabinets/frames.

BACKGROUND

Many companies, e.g., telecommunications companies, global internet service providers, etc., utilize modular electronic equipment for communications and computing that may be placed in equipment cabinets/frames or blade servers and connected to other electronic equipment. The modular equipment may take the form of removable circuit cards disposed in a vertical orientation and supported by an electronics subrack within the equipment cabinet/frame. Electronic equipment generates heat when operated. If too much heat is generated the electronic equipment may not operate properly or there may be a risk of fire. Thus, equipment cabinets/frames require cooling.

Electronic equipments cabinets/frames rely on forced air convection and draw air in from the surrounding environment to cool the electronics. Currently, high heat dissipating cabinets/frames transfer their hot exhaust into the environment in which it is enclosed, e.g., a Central Office, a data center, or other enclosure housing electronic equipment cabinet/frames. Also, existing high heat dissipating solutions remove heat at a room level, i.e. the entire Central Office, data center, or other enclosure housing electronic equipment cabinets/frames. Disadvantageously, the entire equipment room ambient environment must be controlled, which may cause high levels of temperature stratification, i.e., an uneven distribution of temperature throughout the equipment room, which in turn increases cooling costs. Also disadvantageously, in some cases, equipment rooms are at their capacity for air conditioning units.

Extracting heat at a room level is not an effective method of removing extreme levels of thermal energy. Cabinets/frames are designed to intake a supply of cooling air just above the room floor, or at mid frame height. Low power cabinets/frames may often be placed directly in contact with high power cabinets/frames. Unevenly controlled air temperature causes "hot spots" in the room ambient air, especially near and around high energy electronic equipment. Disadvantageously, when uneven temperature distribution occurs within the room, high levels of recirculated heated air may occur, which may lead to premature failure of electronic equipment.

SUMMARY

It has been recognized, in accordance with the principles of the invention, that the problems of the prior art can be overcome by a modular in-frame pumped refrigerant distribution system. More specifically, the present invention provides a modular micro-channel heat exchanger having a) a coil operable to circulate a refrigerant and to transfer heat generated by equipment to the refrigerant, and b) a fan tray connected to the coil, the fan tray having one or more fans operable to move air from above or near the equipment to the coil, c) wherein the coil and the fan tray are positioned in an equipment cabinet close to the equipment which generates the heat.

Also, the present invention provides a method having the steps of a) receiving a refrigerant in a shelf of an equipment cabinet close to equipment that generates heat, b) transferring the heat from air above and near the equipment to the refrigerant, and c) circulating the refrigerant to extract the heat.

Furthermore, the present invention provides another apparatus having a) means for receiving a refrigerant in a shelf of an equipment cabinet close to equipment that generates heat, b) means for transferring the heat from air above and near the equipment to the refrigerant, and c) means for circulating the refrigerant to extract the heat.

Still further, the present invention provides a system having a micro-channel heat exchanger positioned in an equipment cabinet close to equipment that generates heat, the micro-channel heat exchanger being operable to circulate a refrigerant and to transfer a portion of the heat from air near the equipment to the refrigerant.

DESCRIPTION OF THE DRAWINGS

FIG. 2 shows an illustrative embodiment of an interior of two micro-channel heat exchangers arranged in accordance with the principles of the invention;

DETAILED DESCRIPTION

The present invention provides one or more micro-channel heat exchangers that may be placed above, below or very close, i.e., adjacent, to a heat load in an equipment cabinet/frame to extract extremely high heat loads, e.g., greater than 10,000 Watts. The heat load may be associated with one or more shelves of equipment, e.g., electronic equipment, which generate heat when in operation.

Figure 1A:
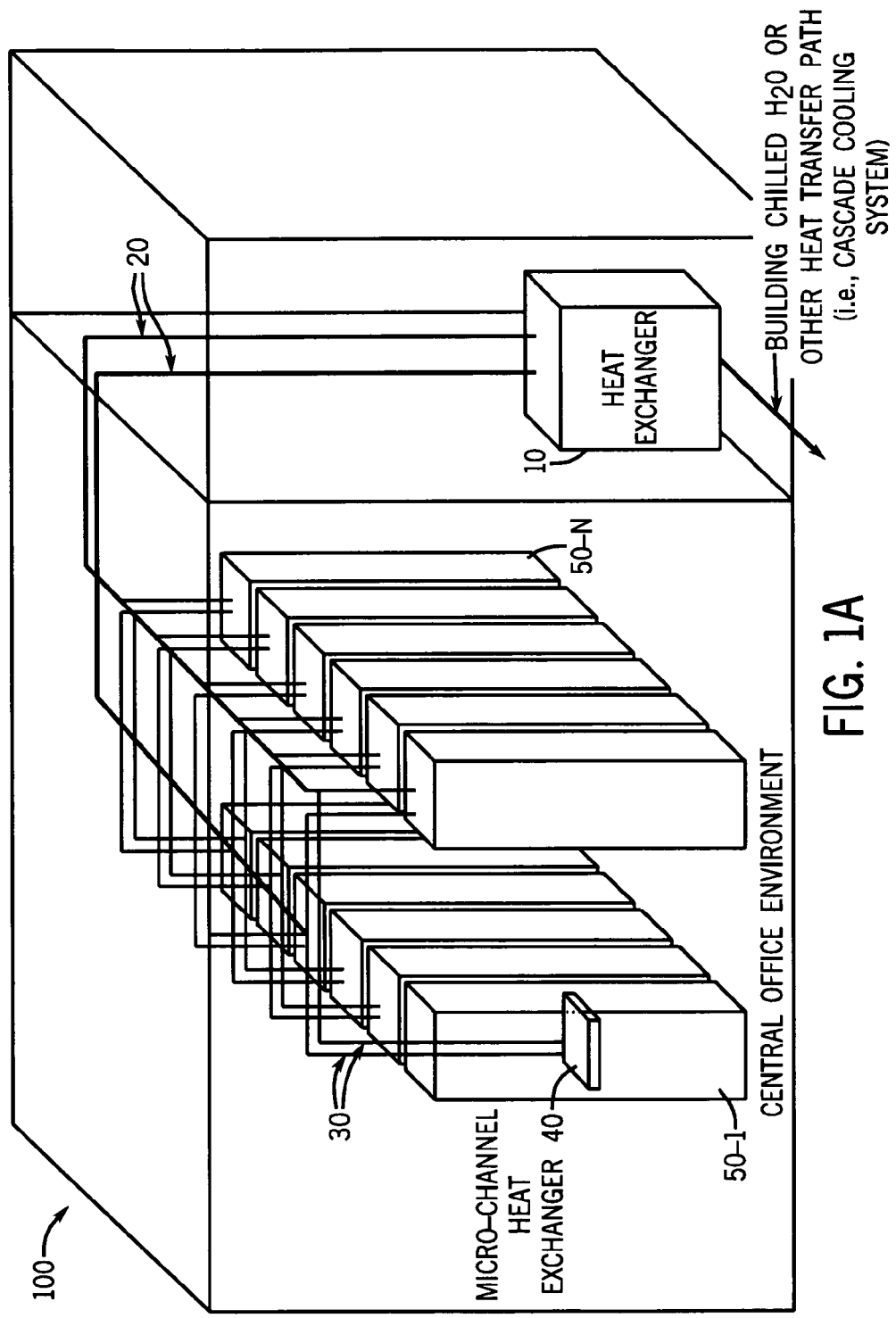
FIG. 1A shows an illustrative embodiment of a modular in-frame pumped refrigerant distribution system arranged in accordance with the principles of the invention.

FIG. 1A shows an illustrative embodiment of a modular in-frame pumped refrigerant distribution system arranged in accordance with the principles of the invention. In FIG. 1A, the modular in-frame pumped refrigerant distribution system 100 shows heat exchanger 10 connected to refrigerant lines 20. Refrigerant lines 20 connect to flexible hose 30. Flexible hose 30 connects to micro-channel heat exchanger 40 via a junction, not shown. Micro-channel heat exchanger 40 is positioned in an enclosure of equipment cabinet 50-1 above equipment, not shown. Equipment cabinets 50-1 to 50-N, are collectively hereinafter equipment cabinets 50. Equipment cabinets 50 house equipment that generates heat when operated. The equipment is housed in multiple shelves of equipment cabinets 50.

Heat exchanger 10 pumps a refrigerant to micro-channel heat exchanger 40 to extract heat generated by equipment located in equipment cabinets. Heat exchanger 10 may be located external to the equipment cabinets 50. Heat exchanger 10 uses a primary flow path for refrigerant supplied to micro-channel heat exchanger 40 and a secondary flow path for refrigerant and extracted heat returned from micro-channel heat exchanger 40. The primary flow path and the secondary flow path may be parallel. In the primary flow path, Heat exchanger 10 pumps the refrigerant in a liquid state via refrigerant lines 20 which connect to flexible hose 30 which connects to micro-channel heat exchanger 40. In the secondary flow path, extracted heat with the refrigerant may be returned from micro-channel heat exchanger 40 via flexible hose 30 which connects to refrigerant lines 20 which connect to Heat exchanger 10. Heat exchanger 10 may remove the extracted heat from the building via a building chilled water system or an outdoor condenser unit. Afterwards, the refrigerant may be recycled by Heat exchanger 10.

The volume of pumped refrigerant may be increased to accommodate larger heat loads. Increasing the volume of pumped refrigerant may require increasing the pump size of Heat exchanger 10. Heat exchanger 10, in one embodiment, may comprise one or more of a Liebert XDP Pumping Unit, when a building chilled water system is available.

The preferred refrigerant for the modular in-frame pumped refrigerant distribution system 100 is R134a. This is because R134a is relatively non-toxic compared to other refrigerants, R134a is heavier than air in its gaseous state, and R134a has no Ozone depletion potential. Also, R134a does not contain oil, e.g., refrigerant oil, in the present invention and R134a is not electrically conductive. Furthermore, R134a may be regulated to eliminate the possibility of condensation forming on a cooled surface. Thus, pumped R134a will not cause electrical shorting in the event of a mechanical failure, and R134a poses minimum to no risk to personnel should a system failure occur. However, other refrigerants, e.g., R 12, R 404, etc., with similar properties may be used.

Flexible hose 30 is used to convey refrigerant and may be made of refrigerant grade rubber, which is commercially available. Flexible hose 30 enables flexible connection from rigid refrigerant lines 20 to the equipment cabinet and ensures compatibility with Network Equipment Building System (NEBS) requirements with respect to shock and vibration. In another embodiment of the invention, flexible hose 30 may be a flexible pipe made of pliable metal or a flexible tube made of plastic.

Refrigerant lines 20 are used to convey refrigerant and may be made of copper. Refrigerant lines 20, in one embodiment, may comprise one or more of Liebert XD Piping.

Micro-channel heat exchanger 40 transfers the heat from the air above and/or near the equipment in the equipment cabinets to the refrigerant. Each micro-channel heat exchanger system may be sized to a capacity that is slightly larger than the power output of a typical equipment cabinet used in many applications today. Thus, a single micro-channel heat exchanger may be sufficient to cool an entire equipment cabinet in most current applications.

In FIG. 1A, micro-channel heat exchanger 40 is positioned in a shelf within equipment cabinet 50-1, and may be positioned above or close to the shelves having the equipment that generates the heat. When micro-channel heat exchanger 40 receives the refrigerant, micro-channel heat exchanger 40 may continue to circulate the refrigerant as a liquid if the heat load of the equipment is sufficiently low. If the heat load of the equipment in the equipment cabinet is extremely high, such as during a peak thermal load condition, e.g., a 6 kilowatt heat load, the refrigerant may be converted from a liquid state to a gaseous state. The gaseous state is more efficient than a liquid state for heat removal. Illustratively, if a leak were to occur in flexible hose 30, the refrigerant would escape as a gas, thus causing no damage to the equipment within the controlled space. Also illustratively, a single leak in flexible hose 30 would only affect the cooling of a single equipment cabinet. In some instances, the refrigerant may be in both a liquid and a gas stage, i.e., only a portion of the liquid may be converted to the gaseous state. When micro-channel heat exchanger 40 returns the refrigerant and extracted heat to Heat exchanger 10, the refrigerant may be re-condensed to the liquid state by Heat exchanger 10.

Figure 1B:
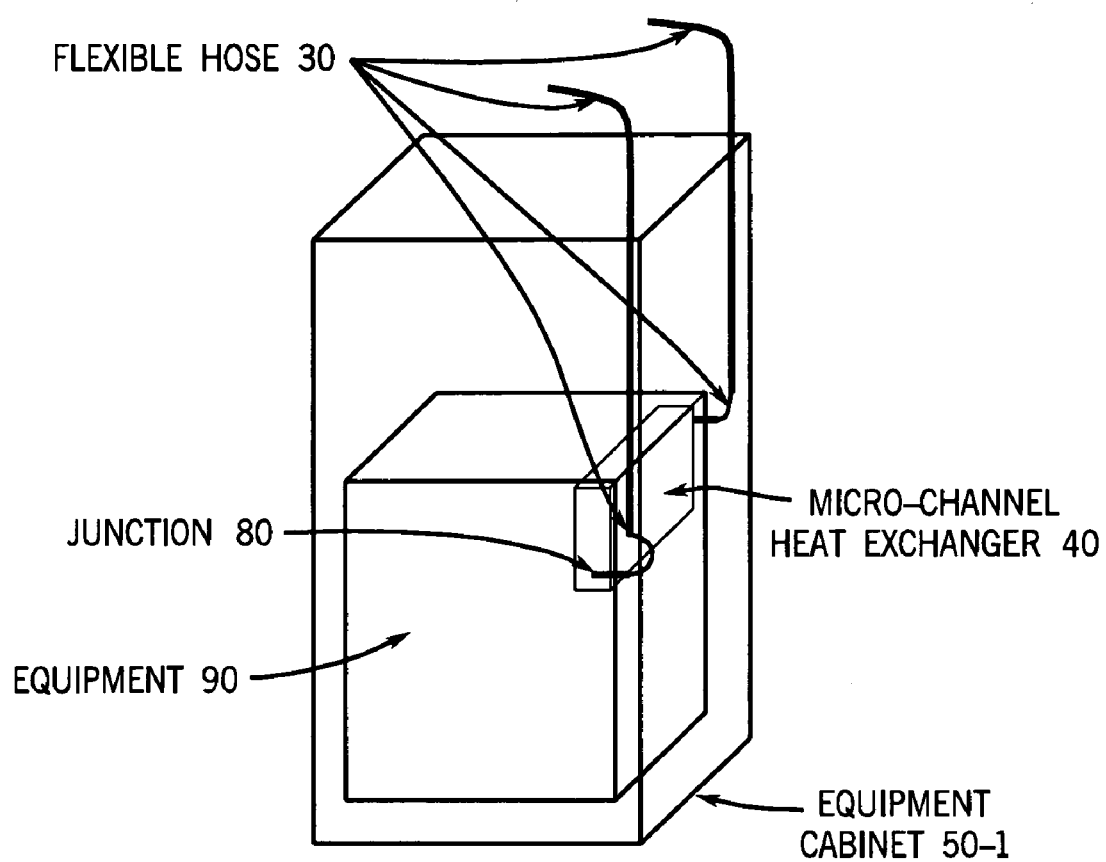
FIG. 1B shows another illustrative embodiment of a modular in-frame pumped refrigerant distribution system arranged in accordance with the principles of the invention.

FIG. 1B shows another illustrative embodiment of a modular in-frame pumped refrigerant distribution system arranged in accordance with the principles of the invention. Rather than positioning micro-channel heat exchanger 40 above the equipment that generates heat as in FIG. 1A, in FIG. 1B, micro-channel heat exchanger 40 is positioned at the back of the equipment that generates the heat. In FIG. 1B, hot air may be discharged from the back side of equipment 90, which is located in equipment cabinet 50-1. Micro-channel heat exchanger 40 is positioned at the back side of the equipment 90 to capture the heat from the exhaust of equipment 90. Micro-channel heat exchanger 40 connects to flexible hose 30 via junction 80 to receive the pumped refrigerant used to carry at least a portion of the heat generated by equipment 90.

In yet another illustrative embodiment of a modular in-frame pumped refrigerant distribution system, not shown, micro-channel heat exchanger 40 may be positioned below each shelf of the equipment that generates the heat.

FIG. 2 shows an illustrative embodiment of an interior of two micro-channel heat exchangers arranged in accordance with the principles of the invention. In FIG. 2, micro-channel heat exchanger 240 (*a*) and micro-channel heat exchanger 240 (*b*), collectively hereinafter micro-channel heat exchanger 240, each have a coil 260 connected to a fan tray 270. Also, coil 260 connects to junction 280. Coil 260 and fan tray 270 are housed in a modular enclosure.

Coil 260 is a cooling coil with internal flow paths, i.e., channels, operable to circulate a refrigerant. The inside of the channels may have surface features, e.g., ribs, to enhance heat transfer. Coil 260 circulates the refrigerant to carry heat generated by the equipment in the equipment cabinets. Coil 260 receives the refrigerant via junction 280, which connects to a flexible hose, e.g., flexible hose 30. Coil 260 is a passive device, with no moving parts. The thickness of coil 260 may be determined by the power capacity of the equipment cabinets, e.g., 6 kilowatts or greater.

Fan tray 270 transfers the heat from air above and/or near the equipment to the refrigerant in coil 260. Fan tray 270 may move approximately 525 cubic feet per minute. The fans used in fan tray 270 may operate on direct current, e.g., −48 volts d.c. The fan speed of fans used in fan tray 270 may or may not be variable. The fan speed may or may not be controlled to maintain the exit air temperature at or below a certain level.

The number of fans used in fan tray 270 is variable. In some equipment cabinets there may be sufficient room to place larger fans, in terms of diameter and height, while in other equipment cabinets the height may be restricted, requiring the use of smaller fans and a larger number of fans. Therefore, the number of required fans in fan tray 270 will vary depending on the application.

The position of fan tray 270 with respect to coil 260 is variable. Fan tray 270 may be placed either after coil 260, as shown in micro-channel heat exchanger 240 (*a*) or before coil 260, as shown in micro-channel heat exchanger 240 (*b*). Also, fan tray 270 may be placed either parallel or perpendicular to coil 260, or at any angle with respect to coil 260.

Figure 3:
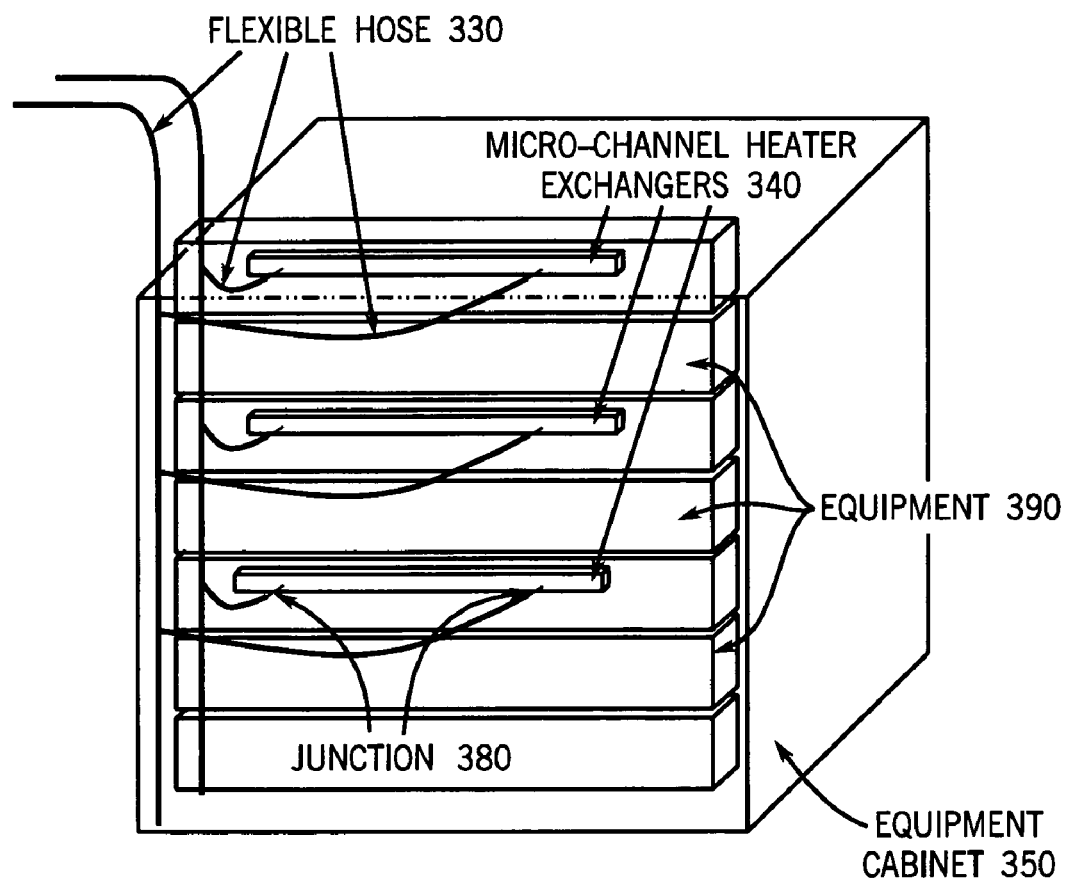
FIG. 3 shows an illustrative embodiment of multiple micro-channel heat exchangers in a typical single equipment cabinet arranged in accordance with the principles of the invention.

FIG. 3 shows an illustrative embodiment of multiple micro-channel heat exchangers in a single equipment cabinet arranged in accordance with the principles of the invention. FIG. 3 illustrates how the modular in-frame pumped refrigerant distribution system 100 is expandable and upgradeable to accommodate significantly higher heat loads. In FIG. 3, flexible hose 330 supplies and returns a refrigerant supplied from a heat exchanger, not shown. Flexible hose 330 connects to junction 380 of micro-channel heat exchangers 340. Each of micro-channel heat exchangers 340 are positioned above one of equipment 390 in equipment cabinet 350.

The modular in-frame pumped refrigerant distribution system 100 may have a monitoring system, not shown, such as thermo-couplers, placed through-out the equipment cabinet, to monitor the temperature of the heat load, detect loss of refrigerant and to isolate failed cooling components. The monitoring system may take samples of the ambient air within the equipment cabinet. If a leak should occur, the refrigerant flow to the affected section of the cooling system may be isolated to prevent further loss of refrigerant.

The modular in-frame pumped refrigerant distribution system 100 will be robust and meet NEBS requirements for shock, vibration, seismic, temperature, humidity, fire, and corrosion. Also, the modular in-frame pumped refrigerant distribution system 100 will regulate the flow of refrigerant into an equipment cabinet to limit condensation within the equipment cabinet and to prevent the development of condensed moisture from the room ambient environment accumulating on the coil of micro-channel heat exchangers. This feature is important because condensation deposits on electrical systems may cause deterioration of components and catastrophic failure.

Those of ordinary skill in the art will readily be able to select heat exchangers, refrigerant lines, flexible hose, micro-channel heat exchangers, a building chilled water system or an outdoor condenser unit appropriate for use in any particular implementation of the modular in-frame pumped refrigerant distribution system.

Advantageously, placing the micro-channel heat exchangers inside of the equipment cabinet to remove heat at its source prevents unwanted by-pass of heated air into the equipment room, enables a highly efficient heat removal system and lowers a company's cooling costs. Also advantageously, the equipment room ambient temperature control system may not need to compensate for any of the heat load produced in the equipment frame fitted with the modular in-frame pumped refrigerant distribution system 100. Further advantageously, premature failure of electronic equipment may be prevented. The modular in-frame pumped refrigerant distribution system 100 may be used wherever high power electronics enclosures exist, with the exception of a system operating in an environment in total vacuum.

Figure 4:
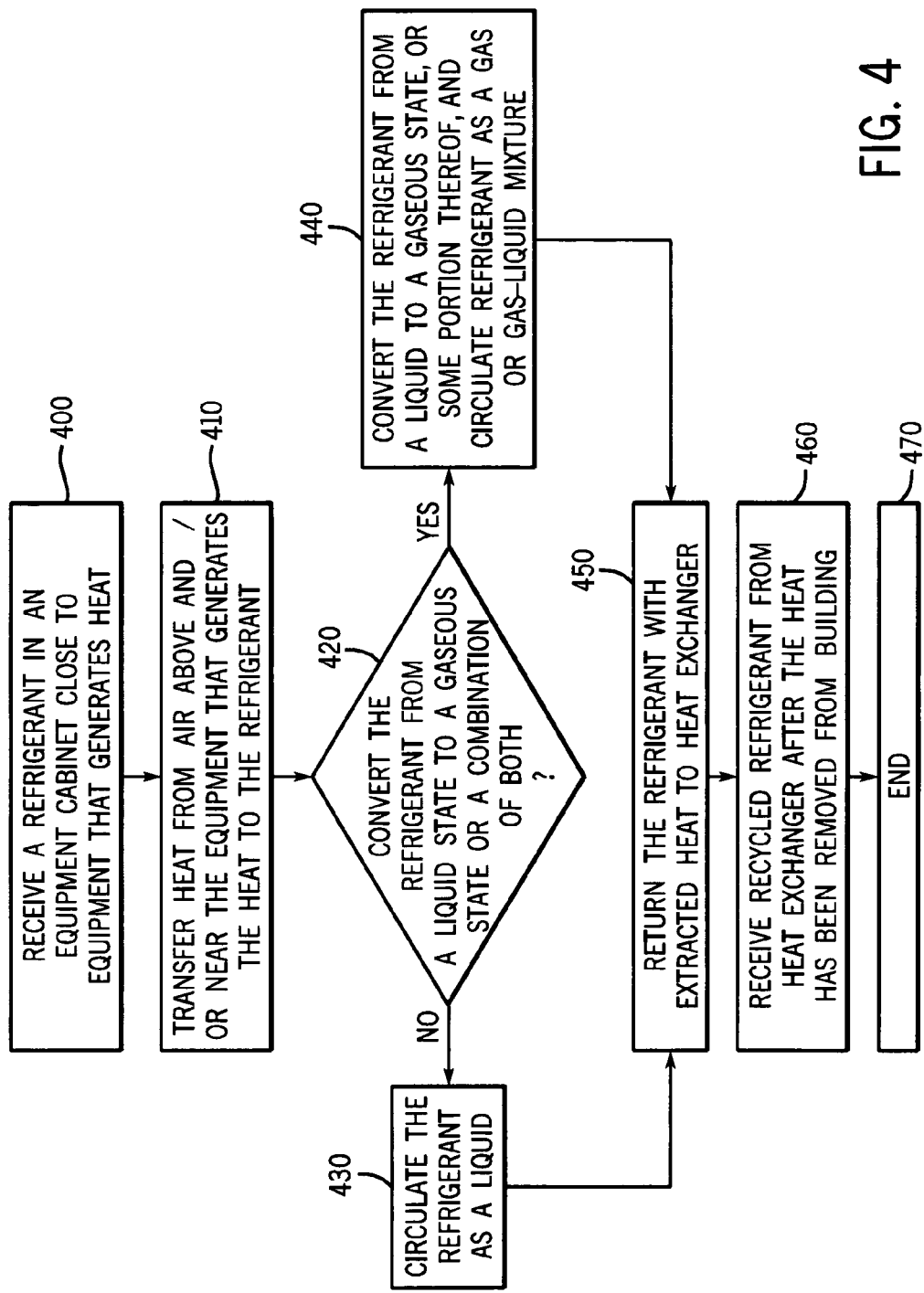
FIG. 4 shows an illustrative flow chart for a method of operating the in-frame pumped refrigerant distribution system arranged in accordance with the principles of the invention.

FIG. 4 shows a flow chart for a method of operating the modular in-frame pumped refrigerant distribution system 100 arranged in accordance with the principles of the invention. The process is entered in step 400 when micro-channel heat exchanger 40 (FIG. 1A), positioned in an equipment cabinet close to equipment that generates heat, receives a refrigerant supplied from heat exchanger 10 via refrigerant lines 20 which connect to the supply line of flexible hose 30. The preferred refrigerant for the modular in-frame pumped refrigerant distribution system 100 is R134a, which does not contain a refrigerant oil in the present invention.

In step 410 (FIG. 4), fan tray 270 (FIG. 2) moves air within the system, from air above and/or near equipment 390 (FIG. 3) to coil 260 (FIG. 2). Coil 260 transfers heat to the refrigerant flowing through internal flow paths, i.e., channels. The inside of the channels may have surface features, e.g., ribs, to enhance heat transfer.

In step 420 (FIG. 4), it is necessary determine whether micro-channel heat exchanger 40 (FIG. 1A) will convert the refrigerant from a liquid state to a gaseous state, or some combination of both.

If the test result in conditional branch point 420 (FIG. 4) is NO, indicating that the heat load is not sufficiently high for the conversion, then control is passed to step 430 (FIG. 4). If the test result in step 420 is YES, indicating that the heat load is sufficiently high for some, most or all of the conversion to take place, then control is passed to step 440.

In step 430 (FIG. 4), coil 260 (FIG. 2) circulates the refrigerant as a liquid and one or more fans within fan tray 270 moves air within the system, from above and/or near equipment 390 (FIG. 3) to coil 260 (FIG. 2). Coil 260 transfers heat to the refrigerant flowing through it.

In step 440 (FIG. 4), coil 260 (FIG. 2) converts the refrigerant from a liquid state to a gaseous state, and circulates the refrigerant as a gas or some combination of gas and liquid, e.g., a gas-liquid mixture. The one or more fans within fan tray 270 continue to move air within the system, from above and/or near equipment 390 (FIG. 3) to coil 260 (FIG. 2). Coil 260 transfers heat to the refrigerant flowing through it.

In step 450 (FIG. 4), micro-channel heat exchanger 40 (FIG. 1A) returns the refrigerant with an extracted portion of the generated heat to heat exchanger 10 via the return line of flexible hose 30 connected to refrigerant lines 20.

In step 460 (FIG. 4), Heat exchanger 10 (FIG. 1 A) may remove the extracted heat from the building via a building chilled water system, not shown, or an outdoor condenser unit, not shown. Afterwards, Heat exchanger 10 may pump chilled recycled refrigerant to micro-channel heat exchanger 40.

The process is exited in step 470.

In practice, telecommunications system processes are implemented in computer software using high-performance processors and high-capacity storage elements such as hard disk subsystems. The computer program code that implements particular telecommunications system functions is stored on computer-readable media, such as the hard disk system, and executed by the processor.

The steps or operations described herein are intended as examples. There may be many variations to these steps or operations without departing from the spirit of the invention. For instance, the steps may be performed in a different order, or steps may be added, deleted, or modified.

The foregoing merely illustrates the embodiments of the invention. It will thus be appreciated that those skilled in the art will be able to devise various arrangements, which, although not explicitly described or shown herein, embody the principles of the invention, and are included within its spirit and scope.

What is claimed:

1. A modular micro-channel heat exchanger comprising:
a coil operable to circulate a refrigerant and to transfer heat generated by equipment to the refrigerant; and
a fan tray connected to the coil, the fan tray having one or more fans operable to move air from above or near the equipment to the coil;
wherein the coil and the fan tray are positioned in an equipment cabinet close to the equipment which generates the heat, and wherein the micro-channel heat exchanger is operable to return the refrigerant with an extracted portion of the generated heat to a heat exchanger located external to the equipment cabinet.

2. The modular micro-channel heat exchanger of claim 1 wherein the coil receives the refrigerant in a liquid state via a junction which connects to one or more flexible hose.

3. The modular micro-channel heat exchanger of claim 2 wherein the coil converts at least a portion of the received liquid refrigerant to a gaseous state during a peak thermal load condition.

4. The modular micro-channel heat exchanger of claim 1 wherein the coil and the fan tray are positioned on a shelf above or below the equipment.

5. The modular micro-channel heat exchanger of claim 1 wherein the coil and the fan tray are positioned on a back side of the equipment.

6. The modular micro-channel heat exchanger of claim 1 wherein the coil has channels with surface features which enhance heat transfer.

7. The modular micro-channel heat exchanger of claim 1 wherein a fan speed of the one or more fans is controlled to maintain an exit air temperature at a certain level.

8. A method, comprising the steps of:
receiving a refrigerant in a shelf of an equipment cabinet close to equipment that generates heat;
transferring the heat from air above and near the equipment to the refrigerant;
circulating the refrigerant to extract the heat; and
returning the refrigerant with an extracted portion of the generated heat to a heat exchanger located external to the equipment cabinet.

9. The method of claim 8, wherein the refrigerant is R134a.

10. The method of claim 8, further comprising the step of circulating the refrigerant in a received liquid state.

11. The method of claim 10, further comprising the step of converting at least a portion of the refrigerant from the received liquid state to a gaseous state.

12. The method of claim 8 further comprising the step of receiving the refrigerant in a shelf above or on a back side of the equipment that generates the heat.

13. An apparatus, comprising:
means for receiving a refrigerant in a shelf of an equipment cabinet close to equipment that generates heat;
means for transferring the heat from air above and near the equipment to the refrigerant;
means for circulating the refrigerant to extract the heat; and
means for returning the refrigerant with an extracted portion of the generated heat to a heat exchanger located external to the equipment cabinet.

14. The apparatus of claim 13 wherein the refrigerant is R134a.

15. The apparatus of claim 13, further comprising means for circulating the refrigerant in a received liquid state.

16. The apparatus of claim 15, further comprising means for converting at least a portion of the refrigerant from the received liquid state to a gaseous state.

17. The apparatus of claim 13 wherein the means for receiving the refrigerant is positioned in a shelf above the equipment that generates the heat.

18. A system, comprising:
a micro-channel heat exchanger positioned in an equipment cabinet close to equipment that generates heat, the micro-channel heat exchanger being operable to circulate a refrigerant and to transfer a portion of the heat from air near the equipment to the refrigerant;
one or more flexible hose connected to the micro-channel heat exchanger via a junction;
one or more refrigerant lines connected to the one or more flexible hose; and
an external heat exchanger connected to the refrigerant lines, the external heat exchanger being located external to the equipment cabinet;
wherein the micro-channel heat exchanger is operable to receive the refrigerant supplied by the external heat exchanger along a first flow path, and the micro-channel heat exchanger is operable to return the refrigerant with the portion of the heat to the external heat exchanger along a second flow path.

19. The system of claim 18 wherein the micro-channel heat exchanger is operable to receive the refrigerant in a liquid state via the junction.

20. The system of claim 19 wherein the micro-channel heat exchanger is operable to convert at least a portion of the received liquid refrigerant to a gaseous state during a peak thermal load condition.

21. The system of claim 19 wherein the micro-channel heat exchanger is operable to convert substantially all of the received liquid refrigerant to a gaseous state during a peak thermal load condition.

22. The system of claim 18 wherein the micro-channel heat exchanger is operable to receive recycled refrigerant excluding the heat from the external heat exchanger along the first flow path.

23. The system of claim 18 wherein the micro-channel heat exchanger is positioned on a shelf above the equipment that generates the heat.

24. The system of claim 18 wherein the micro-channel heat exchanger is positioned on a back side of the equipment that generates the heat.

25. The system of claim 18 wherein the micro-channel heat exchanger is positioned on a shelf below the equipment that generates the heat.

26. The system of claim 18, wherein the refrigerant is R134a.

27. The system of claim 18, wherein the refrigerant does not contain oil.

28. The system of claim 18, further comprising a second micro-channel heat exchanger positioned in the equipment cabinet.

29. The system of claim 18, further comprising a monitoring system coupled to the equipment cabinet, the monitoring system being operable to detect loss of the refrigerant and to isolate failed cooling components.

* * * * *